United States Patent
Goto et al.

(10) Patent No.: US 12,324,125 B2
(45) Date of Patent: Jun. 3, 2025

(54) ELECTRIC CIRCUIT DEVICE

(71) Applicants: HITACHI ASTEMO, LTD., Hitachinaka (JP); HONDA MOTOR CO., LTD., Tokyo (JP)

(72) Inventors: Akihiro Goto, Hitachinaka (JP); Keiichi Tadokoro, Hitachinaka (JP); Morio Kuwano, Hitachinaka (JP); Masaru Kamoshida, Hitachinaka (JP); Fusanori Nishikimi, Hitachinaka (JP); Tomoyuki Suzuki, Wako (JP)

(73) Assignees: HITACHI ASTEMO, LTD., Hitachinaka (JP); HONDA MOTOR CO., LTD., Tokyo (JP)

( * ) Notice: Subject to any disclaimer, the term of this patent is extended or adjusted under 35 U.S.C. 154(b) by 262 days.

(21) Appl. No.: 17/783,196

(22) PCT Filed: Dec. 10, 2020

(86) PCT No.: PCT/JP2020/046003
§ 371 (c)(1),
(2) Date: Jun. 7, 2022

(87) PCT Pub. No.: WO2021/117803
PCT Pub. Date: Jun. 17, 2021

(65) Prior Publication Data
US 2023/0015460 A1    Jan. 19, 2023

(30) Foreign Application Priority Data
Dec. 10, 2019   (JP) ................. 2019-223178

(51) Int. Cl.
*H05K 7/20*    (2006.01)
*H02M 7/00*    (2006.01)
*H02M 7/42*    (2006.01)

(52) U.S. Cl.
CPC ......... *H05K 7/20272* (2013.01); *H02M 7/003* (2013.01); *H02M 7/42* (2013.01); *H05K 7/20927* (2013.01)

(58) Field of Classification Search
CPC ...... H01L 23/473; H05K 5/0008; H05K 5/03; H05K 5/061; H05K 5/069; H05K 7/1432;
(Continued)

(56) References Cited

U.S. PATENT DOCUMENTS

| | | | |
|---|---|---|---|
| 10,038,287 B2 * | 7/2018 | Yamada | H01R 13/5202 |
| 2014/0043717 A1 * | 2/2014 | Takahashi | F02P 3/02 361/263 |

(Continued)

FOREIGN PATENT DOCUMENTS

| | | | |
|---|---|---|---|
| JP | 10-212917 A | 8/1998 | |
| JP | 2001308246 A * | 11/2001 | ............ H02M 7/003 |

(Continued)

OTHER PUBLICATIONS

International Search Report (with English translation) and Written Opinion in PCT/JP2020/046003 dated Jan. 12, 2021.

*Primary Examiner* — Adrian S Wilson
*Assistant Examiner* — Gage Crum
(74) *Attorney, Agent, or Firm* — Foley & Lardner LLP

(57) ABSTRACT

An electric circuit device includes: a first electric component; a first case that accommodates the first electric component and has a cooling channel for cooling the first electric component and a discharge port of the cooling channel; a second case that accommodates a second electric component and has a communication channel that communicates with a discharge port of the cooling channel; a first seal portion that is provided in a peripheral edge part of a discharge port of the cooling channel and seals the first case and the first electric component; a second seal portion that is provided outside the first seal portion with respect to a discharge port of the cooling channel and seals the first case and the first electric component; a through hole that is provided in the first case between the first seal portion and the second seal portion of and penetrates the first case from the first electric component side to the second case side; and a wall that is provided on one of the first case and the second case to surround a periphery of a discharge port of the cooling channel, and the through hole is provided outside the wall.

4 Claims, 6 Drawing Sheets

(58) Field of Classification Search
CPC ........... H05K 7/20218; H05K 7/20254; H05K 7/20272; H05K 7/20763; H05K 7/2089; H05K 7/20927; G06F 1/20; G06F 1/206; G06F 2200/201
USPC .......................................... 361/689; 277/626
See application file for complete search history.

(56) References Cited

U.S. PATENT DOCUMENTS

| | | | |
|---|---|---|---|
| 2015/0140851 A1 | 5/2015 | Wang | |
| 2017/0054347 A1* | 2/2017 | Lei | H05K 7/20927 |
| 2019/0289753 A1* | 9/2019 | Nakamura | H05K 7/20254 |
| 2020/0390000 A1 | 12/2020 | Sasaki et al. | |

FOREIGN PATENT DOCUMENTS

| | | | | | |
|---|---|---|---|---|---|
| JP | 2003031745 | A | * | 1/2003 | |
| JP | 2005032904 | A | * | 2/2005 | |
| JP | 2005033140 | A | * | 2/2005 | |
| JP | 2007-059602 | A | | 3/2007 | |
| JP | 2011-198781 | A | | 10/2011 | |
| JP | 2011-236996 | A | | 11/2011 | |
| JP | 2014-029780 | A | | 2/2014 | |
| JP | 2015-015815 | A | | 1/2015 | |
| JP | 2015-053763 | A | | 3/2015 | |
| JP | 2015-201564 | A | | 11/2015 | |
| JP | 2016067096 | A | * | 4/2016 | |
| JP | 2016-111250 | A | | 6/2016 | |
| JP | 2017-208265 | A | | 11/2017 | |
| JP | 6351804 | B1 | * | 7/2018 | ............ H02M 7/003 |
| WO | WO-2013/118703 | A1 | | 8/2013 | |
| WO | WO-2019/098088 | A1 | | 5/2019 | |

* cited by examiner

ELECTRIC CIRCUIT DEVICE

TECHNICAL FIELD

The present invention relates to an electric circuit device.

BACKGROUND ART

An electric circuit device including a power semiconductor module having a power switching element and performing power conversion has high conversion efficiency, and thus is widely used for consumer use, in-vehicle use, railway use, transformation equipment, and the like.

Such electric circuit device including a power semiconductor module has a cooling channel for cooling heat generated from the power semiconductor module, but there is a risk that cooling water leaks from the cooling channel and corrodes electric components inside the electric circuit device. Therefore, it is necessary to have a structure for preventing leakage of cooling water.

Examples of such electric circuit device include one with a structure in which a part that corrodes when cooling water adheres is prevented by a double seal structure. In this structure, a lower case accommodating an electric component and a cooling channel for cooling the electric component and an upper case accommodating a circuit board are connected to each other by a connection member inserted into a through hole provided in the both cases. The both cases are assembled so as to be sealed in a watertight manner by a first seal member provided on a peripheral edge part of the lower case. A peripheral edge part of the through hole of the lower case is provided with a second seal member, and a peripheral edge part of a lower case upper lid upper surface is provided with a discharge groove for discharging cooling water that has entered between the both cases (see, for example, PTL 1).

CITATION LIST

Patent Literature

PTL 1: JP 2007-59602 A

SUMMARY OF INVENTION

Technical Problem

In the electric circuit device described in PTL 1, the upper and lower cases are assembled in a watertight manner by the first seal member provided in the peripheral edge part of the case, but a wide space is provided in the lower case accommodating the electric component and the cooling channel. For this reason, when the cooling channel is damaged, it is not possible to prevent the cooling water from leaking from the cooling channel, and it is not possible to protect the electric components, the connection member, and the like.

Solution to Problem

An electric circuit device according to one aspect of the present invention includes: a first electric component; a first case that accommodates the first electric component and has a cooling channel for cooling the first electric component and a discharge port of the cooling channel; a second case that accommodates a second electric component and has a communication channel that communicates with a discharge port of the cooling channel; a first seal portion that is provided in a peripheral edge part of a discharge port of the cooling channel and seals the first case and the first electric component; a second seal portion that is provided outside the first seal portion with respect to a discharge port of the cooling channel and seals the first case and the first electric component; a through hole that is provided in the first case between the first seal portion and the second seal portion of and penetrates the first case from the first electric component side to the second case side; and a wall that is provided on one of the first case and the second case to surround a periphery of a discharge port of the cooling channel, and the through hole is provided outside the wall.

Advantageous Effects of Invention

According to the present invention, it is possible to suppress a coolant leaking from the discharge port of the cooling channel from leaking into the first case.

DESCRIPTION OF EMBODIMENTS

Figure 1:
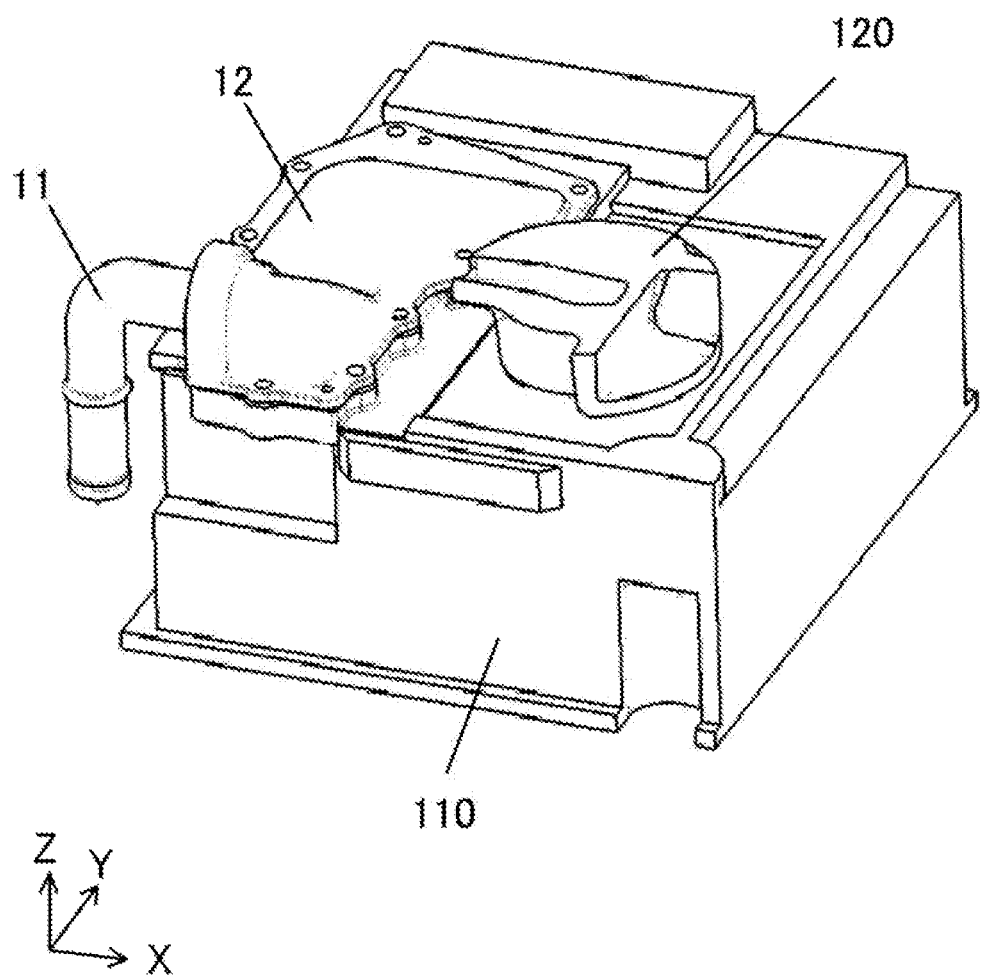
FIG. 1 is an external perspective view of one embodiment of an electric circuit device according to the present invention.

An embodiment of the present invention will be described below with reference to the drawings. The following description and drawings are illustrative of the present invention and are omitted and simplified as appropriate for a clearer description. The present invention can also be carried out in various other forms. Unless otherwise specified, each component may be singular or plural.

For the purpose of facilitating understanding of the invention, the position, size, shape, range, and the like, of each component illustrated in the drawings do not necessarily represent the actual position, size, shape, range, and the like. Therefore, the present invention is not necessarily limited to the position, size, shape, range, and the like, disclosed in the drawings.

Figure 2:
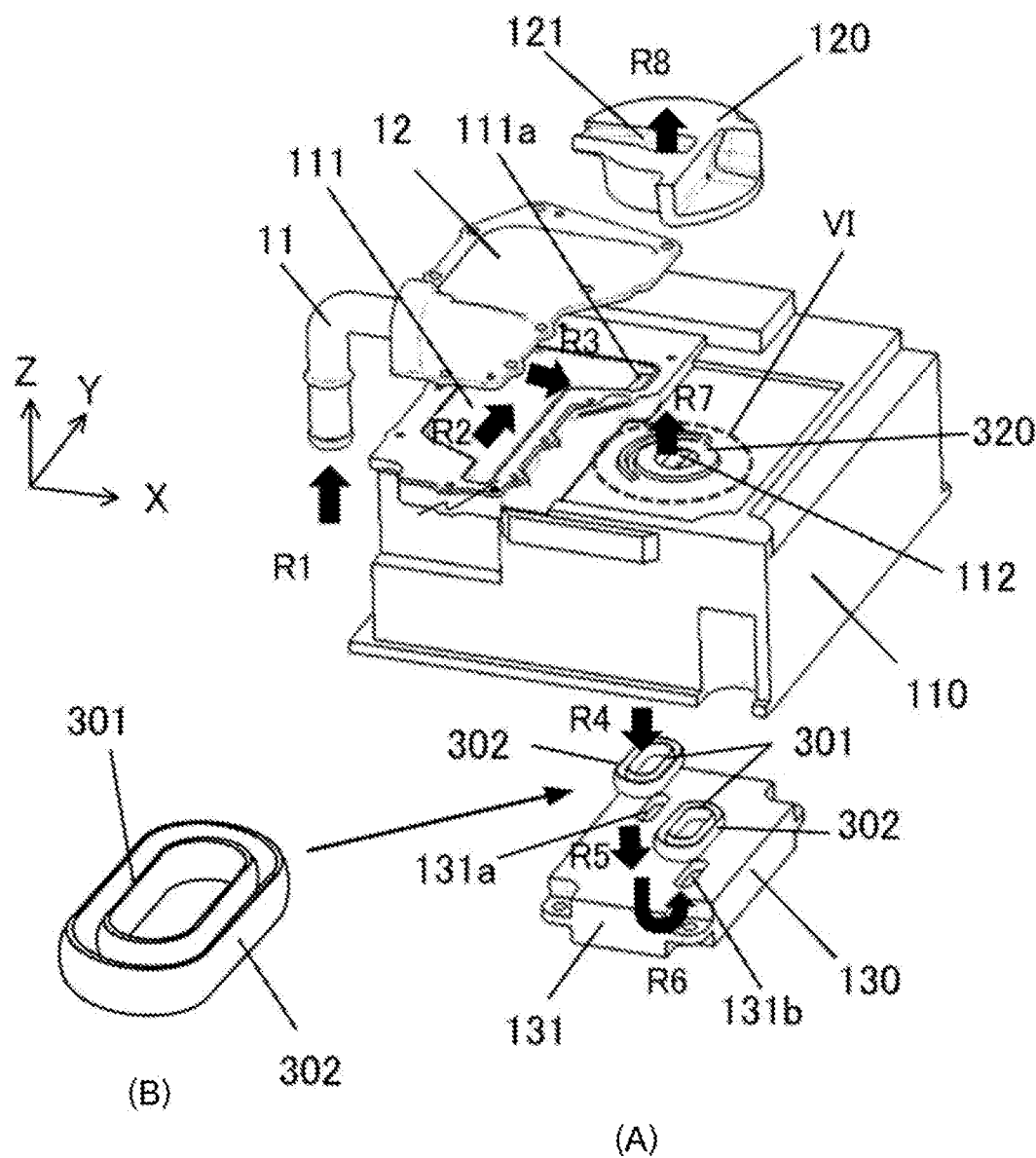
FIG. 2(A) is an exploded perspective view of the electric circuit device illustrated in FIG. 1.
FIG. 2(B) is an enlarged view of a seal portion illustrated in FIG. 2(A).

FIG. 1 is an external perspective view of one embodiment of the electric circuit device according to the present invention, FIG. 2(A) is an exploded perspective view of the electric circuit device illustrated in FIG. 1, and FIG. 2(B) is an enlarged view of the seal portion illustrated in FIG. 2(A).

In the following description, an X direction, a Y direction, and a Z direction are as illustrated in the drawings.

As illustrated in FIG. 1, an electric circuit device 100 includes an inverter case 110 and a motor case 120.

The inverter case 110 has an accommodation part that accommodates a power semiconductor module 130 and a power conversion circuit unit (not illustrated) such as an inverter circuit, and has a box structure in which a lower side (−Z direction side) is opened.

The motor case 120 is a case that accommodates a motor (not illustrated) inside the case. However, in FIGS. 1 and 2(A), only a part of the motor case 120 is illustrated.

The inverter case 110 and the motor case 120 are formed by casting metal such as aluminum or iron.

One side part on the −X direction upper side of the inverter case 110 is attached with an inflow pipe 11 into which a coolant such as cooling water flows. The upper side (Z direction side) of the inverter case 110 is provided with an inflow-side channel part 111 (see FIG. 2(A)) through which a coolant flows. One end part side of the inflow-side channel part 111 is provided with an inflow-side outflow port 111a. The coolant flows into the inflow-side channel part 111 of the inverter case 110 from the inflow pipe 11, and flows, from the inflow-side outflow port 111a, into the accommodation part of the inverter case 110 accommodating the power semiconductor module 130 and other electric components. The upper side (Z direction side) of the inflow-side channel part 111 is covered with a water path lid 12. The water path lid 12 is fixed to the inverter case 110 by a fastening member such as a bolt not illustrated.

The power semiconductor module 130 includes a channel forming body 131 in which a channel for cooling a power semiconductor element (not illustrated) is formed. The channel forming body 131 has a coolant inlet 131a and a coolant outlet 131b. The coolant flowing out from the inflow-side outflow port 111a of the inverter case 110 flows into the channel forming body 131 from the coolant inlet 131a of the channel forming body 131, cools the power semiconductor elements inside the channel forming body 131, and is discharged from the coolant outlet 131b.

The upper side (Z direction side) of the inverter case 110 is provided with a cooling channel discharge port 112 adjacent to the inflow-side channel part 111. The cooling channel discharge port 112 is covered by the motor case 120.

The motor case 120 is provided with a communication channel 121 communicating with the cooling channel discharge port 112 of the inverter case 110. The coolant flowing out from the cooling channel discharge port 112 of the inverter case 110 flows into the motor case 120 from the communication channel 121 of the motor case 120, and cools the motor (not illustrated) accommodated in the motor case 120.

The coolant flows in the order of arrows R1 to R8 illustrated in FIG. 2(A).

As illustrated in FIGS. 2(A) and 2(B), the peripheral edge parts of the coolant inlet 131a and the coolant outlet 131b of the power semiconductor module 130 are provided with a first seal portion 301 and a second seal portion 302, respectively.

The peripheral edge part of the cooling channel discharge port 112 of the inverter case 110 is provided with a wall 320. The wall 320 is integrally molded with the inverter case 110 by molding. Although not illustrated in FIG. 2(A), the peripheral edge part of the inflow-side outflow port 111a and the outside of the wall 320 are provided with a through hole 311 (see FIGS. 4 and 5) penetrating the upper part of the inverter case 110 in the vertical direction (Z direction). In the present embodiment, the first seal portion 301 and the second seal portion 302 seal the power semiconductor module 130 and the inverter case 110 in a watertight manner, and the wall 320 holds the inverter case 110 and the motor case 120 in a watertight manner. Hereinafter, these watertight structures will be described.

Figure 3:
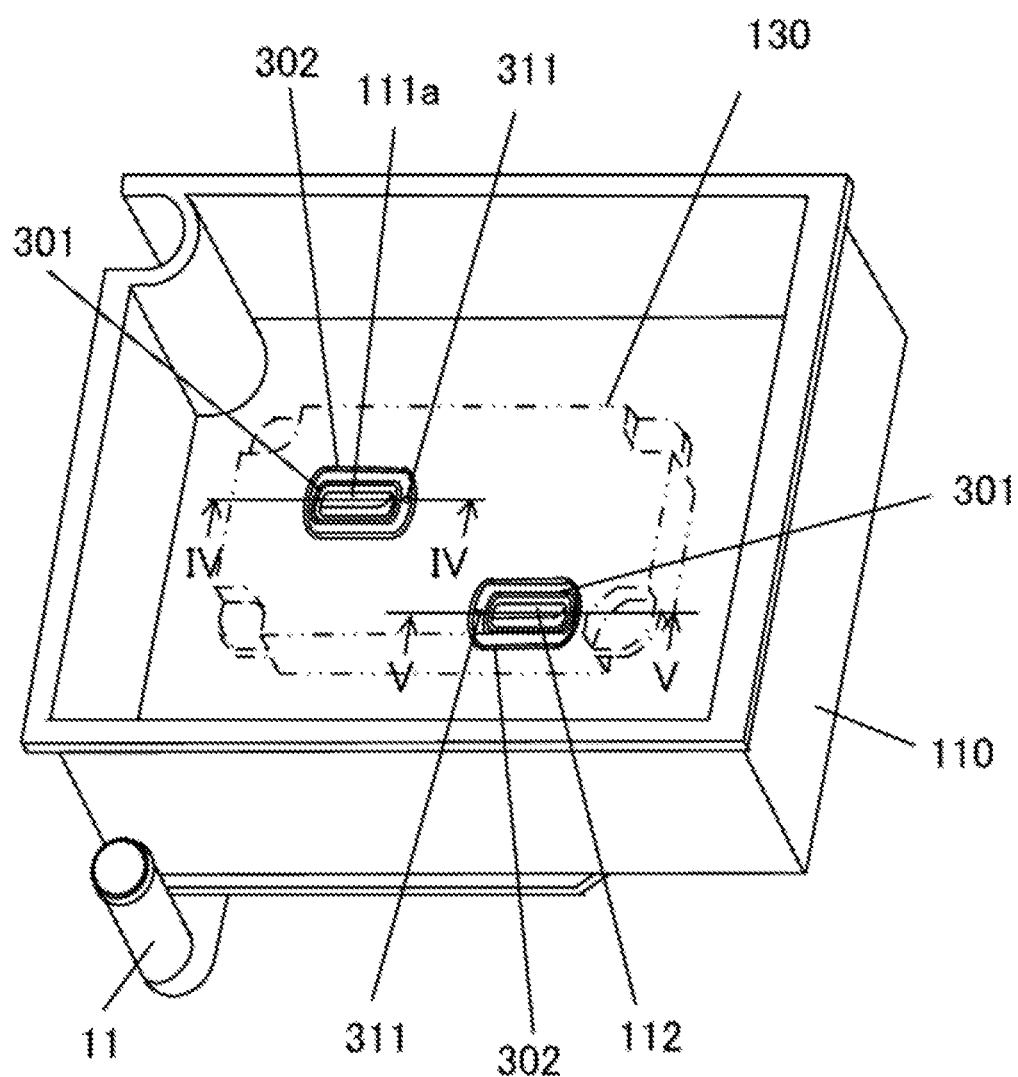
FIG. 3 is a perspective view of an inverter case of the electric circuit device illustrated in FIG. 2(A) as viewed from below.

FIG. 3 is a perspective view of the inverter case of the electric circuit device illustrated in FIG. 2(A) as viewed from below.

The bottom part (Z direction side, upper part in FIG. 2(A)) of the inverter case 110 in FIG. 3 is provided with the inflow-side outflow port 111a and the cooling channel discharge port 112. The inflow-side outflow port 111a and the cooling channel discharge port 112 of the inverter case 110 are provided at positions opposing the coolant inlet 131a and the coolant outlet 131b of the power semiconductor module 130, respectively. In FIG. 3, the power semiconductor module 130 is illustrated with a two-dot chain line.

Figure 4:
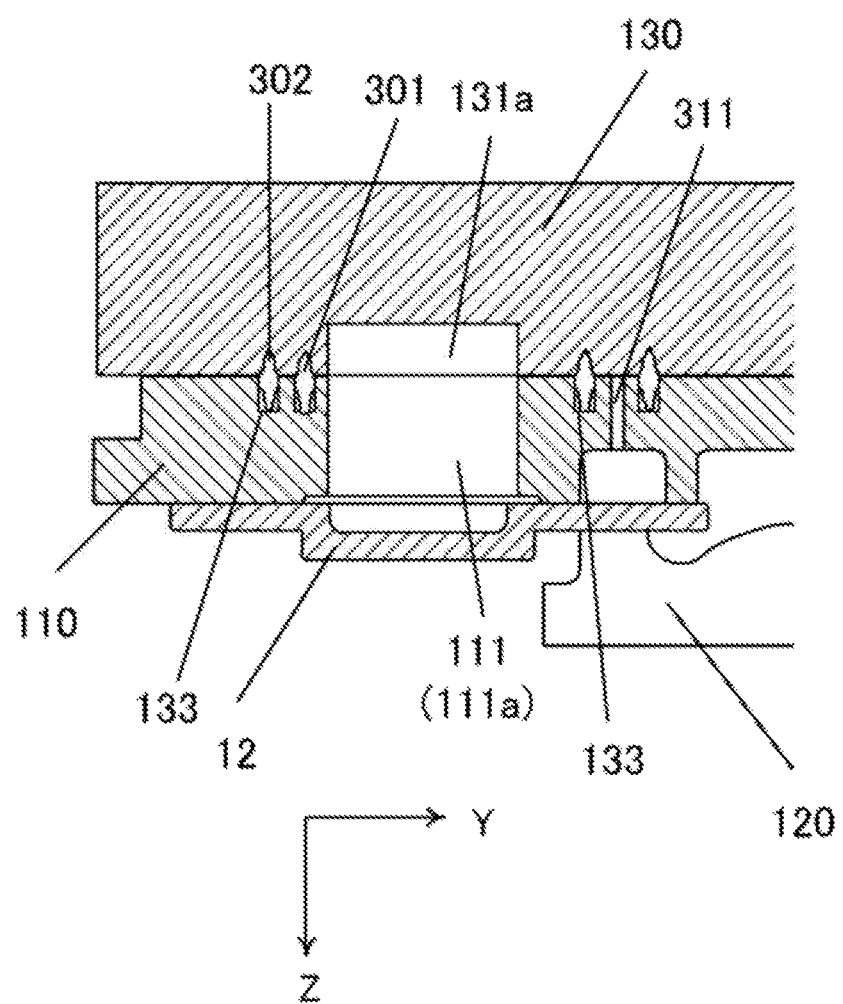
FIG. 4 is a cross-sectional view taken along line IV-IV of the electric circuit device illustrated in FIG. 3.
Figure 5:
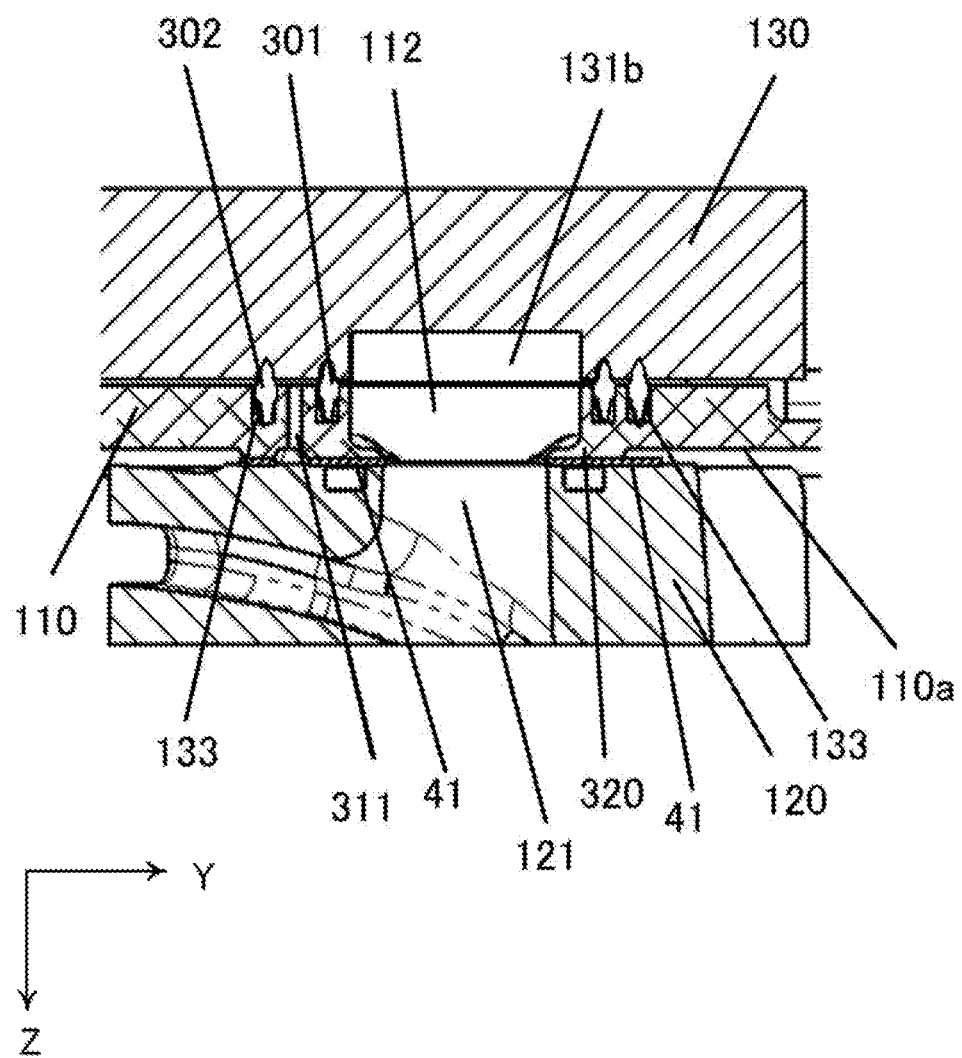
FIG. 5 is a cross-sectional view taken along line V-V of the electric circuit device illustrated in FIG. 3.

FIG. 4 is a cross-sectional view taken along line IV-IV of the electric circuit device illustrated in FIG. 3, and FIG. 5 is a cross-sectional view taken along line V-V of the electric circuit device illustrated in FIG. 3.

As illustrated in FIGS. 3 and 4, the peripheral edge part of the inflow-side outflow port 111a of the inverter case 110 is provided with the first seal portion 301 and the second seal portion 302 that are annular. The first seal portion 301 is provided to surround the periphery of the inflow-side outflow port 111a, and the second seal portion 302 is provided outside the first seal portion 301 to surround the first seal portion 301.

Each of the first and second seal portions 301 and 302 is formed of, for example, a gasket, and is annularly formed by a pair of semi-arc parts and a pair of straight line parts connecting opposing end parts of the semi-arc parts.

The Y direction side of the inflow-side outflow port 111a is provided with the through hole 311 penetrating the bottom part of the inverter case 110 in the vertical direction (Z direction) between the first seal portion 301 and the second seal portion 302. The through hole 311 is provided in a closed space between the first seal portion 301 and the second seal portion 302, and does not have an opening part to the outside. The first and second seal portions 301 and 302 are press-fitted and fixed in a groove 133 (see FIG. 4) provided in the inverter case 110.

As illustrated in FIGS. 3 and 5, the peripheral edge part of the cooling channel discharge port 112 of the inverter case 110 is provided with the first seal portion 301 and the second seal portion 302. The first seal portion 301 is provided to surround the periphery of the cooling channel discharge port 112, and the second seal portion 302 is provided outside the first seal portion 301 to surround the first seal portion 301. Each of the first and second seal portions 301 and 302 is formed of, for example, a gasket, and is annularly formed by a pair of semi-arc parts and a pair of straight line parts connecting opposing end parts of the semi-arc parts.

The −Y direction side of the cooling channel discharge port 112 is provided with the through hole 311 penetrating the bottom part of the inverter case 110 in the vertical direction (Z direction) between the first seal portion 301 and the second seal portion 302. The through hole 311 is provided in a closed space between the first seal portion 301 and the second seal portion 302, and does not have an opening part to the outside. The first and second seal portions 301 and 302 are press-fitted and fixed in a groove 133 (see FIG. 5) provided in the inverter case 110.

As illustrated in FIG. 5, the surface of the inverter case 110 opposing the motor case 120 is provided with the wall 320 protruding in the Z direction. A seal layer 41 having a sheet shape is interposed between the wall 320 and the motor case 120. The seal layer 41 is not provided in a part opposing the through hole 311 and a part where the cooling channel discharge port 112 and the coolant outlet 131*b* communicate with each other. The seal layer 41 is formed by, for example, printing or application of a sealing material, or formed by bonding a sheet-like sealing tape or the like.

Figure 6:
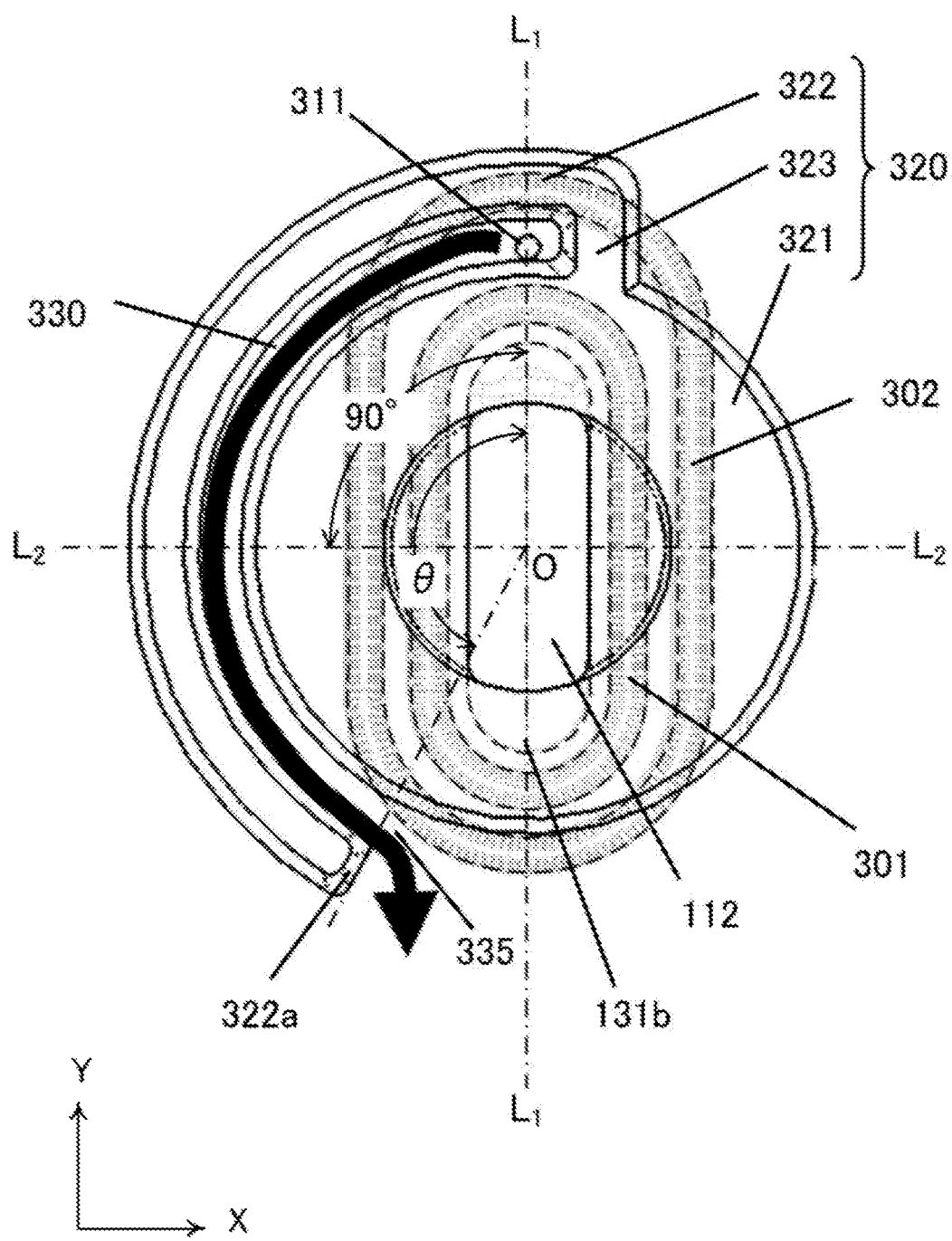
FIG. 6 is a plan view of a region VI of the electric circuit device illustrated in FIG. 2(A) as viewed from above, where a first seal portion, a second seal portion, and a coolant outlet of a power semiconductor module are indicated by dotted lines.

FIG. 6 is a plan view of a region VI of the electric circuit device illustrated in FIG. 2(A) as viewed from above, where the first seal portion 301, the second seal portion 302, and the coolant outlet 131*b* of the power semiconductor module 130 are indicated by dotted lines.

The wall 320 provided in the inverter case 110 includes an inner annular part 321 surrounding the periphery of the cooling channel discharge port 112, an outer arc part 322 provided on the outer peripheral side of the inner annular part 321, and a connection part 323 that causes the inner annular part 321 and the outer arc part 322 to communicate with each other.

The inner annular part 321 and the outer arc part 322 are formed concentrically with the cooling channel discharge port 112. The outer arc part 322 is provided in an arc shape having a length of about a semicircle along the outer periphery of the inner annular part 321. The through hole 311 provided in the inverter case 110 is provided between the inner annular part 321 and the outer arc part 322 in the vicinity of the connection part 323.

The through hole 311 of the inverter case 110 is disposed between the first seal portion 301 and the second seal portion 302. The first seal portion 301 is provided to surround the periphery of the coolant outlet 131*b* of the power semiconductor module 130. The centers in the X direction and the Y direction of the coolant outlet 131*b* of the power semiconductor module 130 are located substantially coaxially with a center O of the cooling channel discharge port 112.

In the outer arc part 322, a tip end part 322*a* on a side opposite to the connection part 323 is separated from the inner annular part 321, and a separation part between the tip end part 322*a* of this outer arc part 322 and the inner annular part 321 is an opening port 335 through which the through hole 311 communicates with the outside.

In other words, the through hole 311 is disposed in a leakage liquid regulation passage region 330 surrounded by the inner annular part 321, the outer arc part 322, and the connection part 323, and is opened to the outside at the opening port 335, which is a separation part between the tip end part 322*a* of the outer arc part 322 and the inner annular part 321.

When flowing through in the coolant outlet 131*b* of the power semiconductor module 130 and the cooling channel discharge port 112 of the inverter case 110, the coolant leaking from the first seal portion 301 flows through the through hole 311 and flows out to inside the leakage liquid regulation passage region 330 of the inverter case 110. Since the second seal portion 302 is provided on the outer peripheral side of the first seal portion 301, the coolant flowing out to inside the leakage liquid regulation passage region 330 does not spread inward the inverter case 110 beyond the second seal portion 302. Since the connection part 323 of the wall 320 is provided in the vicinity of the through hole 311, the coolant flowing out from the through hole 311 moves toward the opening port 335 between the inner annular part 321 and the outer arc part 322. This suppresses the coolant from entering the inverter case 110 through the gap between the power semiconductor module 130 and the inverter case 110. This makes it possible to prevent the coolant from adhering to the electronic components accommodated inside the inverter case 110.

By visually checking that the coolant flows out from the through hole 311 to an outer surface 110*a* of the inverter case 110 through the leakage liquid regulation passage region 330, it is possible to detect that the coolant has leaked from the coolant channel beyond the first seal portion 301. This detection makes it possible to take an appropriate measure such as repair of a leakage portion of the coolant channel before the coolant goes beyond the second seal portion 302.

As illustrated in FIG. 6, a center angle θ at the center O of the cooling channel discharge port 112 of a straight line $L_2$ passing through the tip end part 322*a* of the outer arc part 322 and the center O of the cooling channel discharge port 112 with respect to a straight line $L_1$ passing through the center of the through hole 311 and the center O of the cooling channel discharge port 112 is 90 degrees to 180 degrees. There is a possibility that water, foreign matters, and the like enter the through hole 311 from the opening port 335 of the leakage liquid regulation passage region 330. In the present embodiment, since the leakage liquid regulation passage region 330 has an arc shape, when the center angle θ is 90 degrees or more, water and foreign matters temporarily move in the direction opposite to the through hole 311, and hardly enter the through hole 311. This makes it possible to suppress the through hole 311 from clogging and water and foreign matters from entering the inverter case via the through hole 311.

When the electric circuit device 100 is rapidly cooled, the air in the inverter case 110 is thermally shrunk, and an action of sucking water and foreign matters from the through hole 311 occurs. For example, it is assumed that the electric circuit device 100 is wet with water and rapidly cooled to room temperature of about 20° C. This causes a problem that the air in the inverter case 110 is thermally shrunk and water and foreign matters are sucked from the through hole 311. To solve this problem, in the present embodiment, the volume of the leakage liquid regulation passage region 330, in other words, the volume of the space closed by the inner annular part 321 and the outer arc part 322 of the wall 320 in the space sandwiched between the outer surface 110*a* of the inverter case 110 and the motor case 120, is formed to be larger than the volume in which the air in the inverter case 110 is thermally shrunk by temperature change.

With such structure, even if the electric circuit device 100 is rapidly cooled and the air in the inverter case 110 is thermally shrunk, not the entire air in the leakage liquid regulation passage region 330 is sucked from the through hole 311. Therefore, water and foreign matters outside the leakage liquid regulation passage region 330 are not sucked from the through hole 311, and this makes it possible to suppress the through hole 311 from clogging and water and foreign matters from entering the inverter case via the through hole 311.

According to the above embodiment, the following effects are achieved.

(1) The electric circuit device 100 includes the power semiconductor module (first electric component) 130, the inverter case (first case) 110 that accommodates the power semiconductor module 130 and has the cooling channel discharge port (cooling channel outlet) 112 for cooling the power semiconductor module 130, the motor case (second case) 120 that accommodates the motor (second electric component) and has the communication channel 121 that communicates with the cooling channel discharge port 112, the first seal portion 301 that is provided in the peripheral edge part of the cooling channel discharge port 112 and seals the inverter case 110 and the power semiconductor module 130, the second seal portion 302 that is provided outside the first seal portion 301 with respect to the cooling channel discharge port 112 and seals the inverter case 110 and the power semiconductor module 130, the through hole 311 that is provided in inverter case 110 between the first seal portion 301 and the second seal portion 302 and penetrates the inverter case 110 from the power semiconductor module 130 side to the motor case 120 side, and the wall 320 provided on one of the inverter case 110 and the motor case 120 to surround the periphery of the cooling channel discharge port 112, and the through hole 311 is provided outside the wall 320. Therefore, the coolant leaking from the first seal portion 301 and flowing out from the through hole 311 to the outer surface 110a side of the inverter case 110 is regulated from entering the inverter case 110 by the second seal portion 302 provided on the outer peripheral side of the first seal portion 301. This makes it possible to prevent the electric components accommodated in the inverter case 110 from being corroded by the coolant.

(2) The wall 320 is provided in the inverter case (first case) 110, and the seal layer 41 having a sheet shape is interposed between the wall 320 and the motor case 120 (second case). Therefore, the watertightness between the inverter case 110 and the motor case 120 can be enhanced with a simple structure.

(3) The wall 320 has the inner annular part 321 surrounding the periphery of the cooling channel discharge port 112 and the outer arc part 322 provided outside the inner annular part 321, one end of the outer arc part 322 is connected to the inner annular part 321, the tip end part (other end) 322a of the outer arc part 322 is separated from the inner annular part 321, the through hole 311 is provided between the inner annular part 321 and the outer arc part 322 and in the vicinity of one end of the outer arc part 322 connected to the inner annular part 321, and the center angle θ at the center of the cooling channel of the straight line passing through the tip end part 322a of the outer arc part 322 and the center of the discharge port 112 of the cooling channel with respect to the straight line $L_1$ passing through the center of the through hole 311 and the center of the cooling channel is 90 degrees or more. This makes it difficult for water, foreign matters, and the like to enter the through hole 311 from the opening port 335 where the tip end part 322a of the outer arc part 322 and the inner annular part 321 are separated from each other, and it is possible to suppress the through hole 311 from clogging and water and foreign matters from entering the inverter case via the through hole 311.

(4) The volume between the inner annular part 321 and the outer arc part 322 of the wall 320 provided to surround the through hole 311 in the space sandwiched between the inverter case (first case) 110 and the motor case (second case) 120, in other words, the volume of the leakage liquid regulation passage region 330, is larger than the volume in which the air in the inverter case 110 is thermally shrunk by temperature change. Therefore, even if the electric circuit device 100 is rapidly cooled and the air in the inverter case 110 is thermally shrunk, not the entire air in the leakage liquid regulation passage region 330 is sucked from the through hole 311. Therefore, water and foreign matters outside the leakage liquid regulation passage region 330 are not sucked from the through hole 311, and this makes it possible to suppress the through hole 311 from clogging and water and foreign matters from entering the inverter case via the through hole 311.

In the above embodiment, the first seal portion 301 and the second seal portion 302 are exemplified as a structure of being press-fitted into the groove 133 provided in the inverter case 110. However, a groove may be provided in the power semiconductor module 130, and the first seal portion 301 and the second seal portion 302 may be press-fitted into the groove of the power semiconductor module 130. The first seal portion 301 and the second seal portion 302 may be fixed by using other means such as adhesion instead of press-fitting.

In the above embodiment, the wall 320 for sealing the inverter case 110 and the motor case 120 in a watertight manner has been exemplified as a structure of being integrally molded with the inverter case 110. However, the wall 320 may be integrally molded with the motor case 120.

In the above embodiment, the inverter case 110 and the power semiconductor module 130 have the watertight structure using the first and second seal portions 301 and 302, and the inverter case 110 and the motor case 120 have the watertight structure using the wall 320. Conversely, however, the inverter case 110 and the power semiconductor module 130 may have a watertight structure using the wall 320, and the inverter case 110 and the motor case 120 may have a watertight structure using the first and second seal portions 301 and 302.

In the above embodiment, the power semiconductor module 130 has been exemplified as an electric component accommodated in the inverter case 110. However, the present invention is not limited to the power semiconductor module 130 as an electric component accommodated in the inverter case 110, and can also be applied to, for example, a circuit board unit and other electric components.

In the above embodiment, the structure in which the coolant is supplied from the inverter case 110 to the motor case 120 in which the motor is accommodated has been exemplified. However, the present invention is not limited to the motor as an electric component to which the coolant is supplied via the inverter case 110, and can be applied to other electric components such as a gearbox and a converter.

As described above, the present invention can be applied to a circuit board unit and other electric components instead of the power semiconductor module 130, and can be applied to a gearbox, a converter, and the like instead of the motor. Therefore, the present invention can be applied with a case that accommodates other electric components other than the inverter case 110.

Although various modifications have been described above, the present invention is not limited to the content. Other aspects conceivable within the scope of the technical idea of the present invention are also included in the scope of the present invention.

The disclosure of the following priority application is incorporated herein by reference.

Japanese Patent Application No. 2019-223178 (filed on Dec. 10, 2019)

REFERENCE SIGNS LIST 41 seal layer
100 electric circuit device
110 inverter case (first case)
110a outer surface
111 inflow-side channel part
112 cooling channel discharge port (discharge port of cooling channel)
120 motor case (second case)
121 communication channel
130 power semiconductor module (first electric component)
301 first seal portion
302 second seal portion
311 through hole
320 wall 321 inner annular part
322 outer arc part
322a tip end part (other end)
330 leakage liquid regulation passage region
335 opening port
L₁ straight line
L₂ straight line
O center of cooling channel discharge port

The invention claimed is:

1. An electric circuit device comprising:
a first electric component provided with a body having a coolant inlet and a coolant outlet;
a first case that accommodates the first electric component and has a cooling channel for cooling the first electric component and a discharge port of the cooling channel, wherein a center in a lengthwise direction and a center in a widthwise direction of the coolant outlet of the first electric component are located coaxially with a center of the discharge port of the cooling channel;
a second case that accommodates a second electric component and has a communication channel that communicates with the discharge port of the cooling channel;
a first seal portion that is provided in a peripheral edge part of the discharge port of the cooling channel and seals the first case and the first electric component;
a second seal portion that is provided outside the first seal portion with respect to the discharge port of the cooling channel and seals the first case and the first electric component;
a through hole that is provided in the first case between the first seal portion and the second seal portion and penetrates the first case from a first electric component side to a second electric component side; and
a wall that is provided on one of the first case and the second case,
wherein the wall includes
an inner annular part surrounding a periphery of the cooling channel, and
an outer arc part provided outside the inner annular part,
one end of the outer arc part is connected to the inner annular part, and another end of the outer arc part is separated from the inner annular part,
the through hole is provided between the inner annular part and the outer arc part and in a vicinity of the one end of the outer arc part connected to the inner annular part,
a center angle θ at a center of the cooling channel of a straight line passing through the other end of the outer arc part and a center of the cooling channel with respect to the straight line passing through a center of the through hole and the center of the discharge port of the cooling channel is more than 90 degrees,
wherein a volume between the inner annular part of the wall and the outer arc part of the wall provided to surround the through hole in a space sandwiched between the first case and the second case is larger than a volume in which air in the first case is thermally shrunk by temperature change, and
wherein the inner annular part of the wall and the outer arc part of the wall are formed concentrically with the discharge port of the cooling channel.

2. The electric circuit device according to claim 1, wherein the wall is provided in the first case, and a seal layer having a sheet shape is interposed between the wall and the second case.

3. The electric circuit device according to claim 1, wherein the first electric component is a semiconductor module.

4. The electric circuit device according to claim 1, wherein the first case is an inverter case that accommodates a power conversion circuit unit inside of the inverter case.

* * * * *